(12) United States Patent
Miller et al.

(10) Patent No.: US 6,225,234 B1
(45) Date of Patent: May 1, 2001

(54) IN SITU AND EX SITU HARDMASK PROCESS FOR STI WITH OXIDE COLLAR APPLICATION

(75) Inventors: Alan J. Miller, Moraga; Fandayani Soesilo, Fremont, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/539,293

(22) Filed: Mar. 30, 2000

(51) Int. Cl.$^7$ .................................................. H01L 21/461
(52) U.S. Cl. ............................ 438/734; 438/735; 438/737; 438/738
(58) Field of Search ..................................... 438/734, 735, 438/737, 738

(56) References Cited

U.S. PATENT DOCUMENTS

| | | | |
|---|---|---|---|
| 5,958,801 | * | 9/2000 | Langley .............................. 438/738 |
| 6,037,266 | * | 3/2000 | Tao et al. ............................ 438/738 |
| 6,083,845 | * | 7/2000 | Yang et al. .......................... 438/734 |
| 6,121,098 | * | 9/2000 | Srobl .................................. 438/734 |

* cited by examiner

Primary Examiner—Trung Dang
(74) Attorney, Agent, or Firm—Beyer Weaver & Thomas, LLP (57) ABSTRACT

A method or process for etching a trench in an IC structure is disclosed. The IC structure might be comprised of a plurality of different component materials arranged proximate to one another, all of which need to be etched down to a target level. A first etching chemistry is applied which preferentially etches a one type of component material. A second etching chemistry is applied which preferentially etches another type of component material. The method or process toggles back and forth between the etching chemistries until the target level is reached. The toggling techniques serves to maintain the profiles of the different component materials. One component material might also be embedded, as a collar or otherwise, around another component material. The toggling technique can serve to modulate the height, level, or shape of one material relative to another material. The toggling steps can be performed in situ or ex situ. The toggling technique can be used with different mask materials, including a photoresist or a hardmask over the IC structure.

34 Claims, 8 Drawing Sheets

IN SITU AND EX SITU HARDMASK PROCESS FOR STI WITH OXIDE COLLAR APPLICATION

BACKGROUND OF THE INVENTION

The present invention relates to the fabrication of semiconductor integrated circuits (IC's). More particularly, the present invention relates to a process or method for controlled etching through an IC structure which has two or more materials arranged together, and where the height of one of the materials may need to be modulated relative to the other materials.

During the manufacture of a semiconductor-based product, for example, a flat panel display or an integrated circuit such as a memory cell, multiple deposition and/or etching steps may be employed. By way of example, one method of etching is plasma etching. In plasma etching, a plasma is formed from the ionization and dissociation of process gases. The positively charged ions are accelerated towards the substrate where they, in combination with neutral species, drive the etching reactions. In this manner, etched features such as vias, contacts, or trenches may be formed in the layers of the substrate.

Recently, shallow trench isolation (STI) has grown in popularity as a preferred method for forming a trench that can, among other applications, electrically isolate individual transistors in an integrated circuit. Electrical isolation is needed to prevent current leakage between two adjacent devices (e.g., transistors). Broadly speaking, conventional methods of producing a shallow trench isolation feature include: forming a hard mask over the targeted trench layer, patterning a soft mask over the hard mask, etching the hard mask through the soft mask to form a patterned hard mask, and thereafter etching the targeted trench layer to form the shallow trench isolation feature. Subsequently, the soft mask is removed (e.g., stripped) and the shallow trench isolation feature is back-filled with a dielectric material.

Figure 1A:
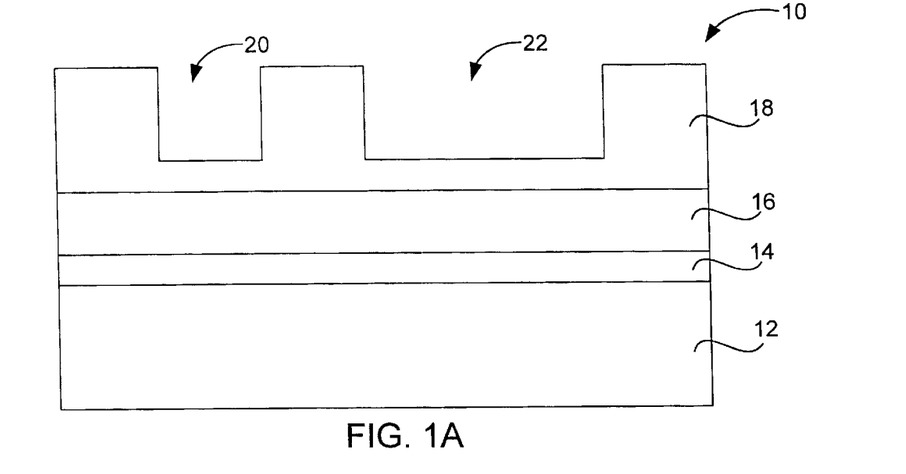
FIG. 1A illustrates a cross-sectional view of a layer stack, representing some of the layers formed during the fabrication of a shallow trench isolation (STI).
Figure 1B:
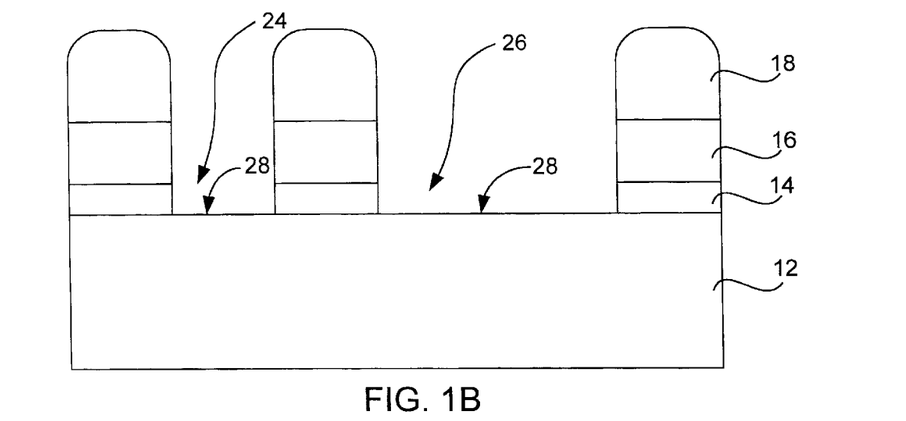
FIG. 1B shows the same layer stack of FIG. 1A after a hard mask has been etched through the nitride and pad oxide layers.
Figure 1C:
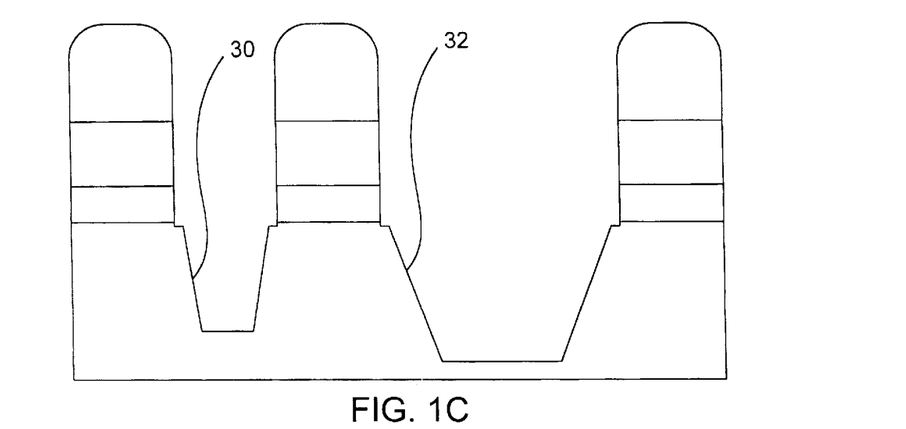
FIG. 1C depicts the same layer stack of FIG. 1A after a shallow trench isolation feature has been etched through the silicon layer.

FIGS. 1A–1C are cross sectional views of the conventional process steps that maybe used to form shallow trench isolation features. Referring initially to FIG. 1A, there is shown a typical layer stack 10 that is part of a substrate or semiconductor wafer (not drawn to scale for ease of illustration). A silicon layer 12 is located at the bottom of layer stack 10. A pad oxide layer 14 is formed above silicon layer 12 and a nitride layer 16 is formed above pad oxide layer 14. In most situations, the pad oxide layer is used as the interlayer that is disposed between the nitride layer and the silicon layer. Furthermore, in order to create a patterned hard mask with pad oxide layer 14 and nitride layer 16, a photoresist layer 18 is deposited and patterned using a conventional photolithography step over nitride layer 16. After patterning, soft mask openings 20 (narrow) and 22 (wide) are created in photoresist layer 18 to facilitate subsequent etching. The above-described layers and features, as well as the processes involved in their creation, are well known to those skilled in the art.

Following the formation of layer stack 10, nitride layer 16 and pad oxide 14 are subsequently etched to create a hard mask, which includes a narrow hard mask opening 24 and a wide hard mask opening 26, as seen in FIG. 1B. The hard mask openings are used to pattern the trench during etching of the silicon layer. For the most part, etching stops after reaching silicon layer 12, however, a small portion 28 on the surface of silicon layer 12 is typically etched away during the etching of pad oxide layer 14. Moreover, a gas chemistry that includes CF4 is generally used to facilitate etching through the nitride and pad oxide layers. Typically, the CF4 chemistry etches the side walls of nitride layer 16, pad oxide layer 14 and small portion 28 of silicon layer 12 anisotropically (i.e., substantially straight down).

Once hard mask openings are created through nitride layer 16 and pad oxide layer 14, silicon layer 12 is etched therethrough to form shallow trench isolation features, for example, a narrow feature 30 and a wide feature 32, as shown in FIG. 1C. Typically, a gas chemistry that includes $Cl_2$ and/or HBr is used to facilitate etching through the silicon layer. Subsequent to the steps shown in FIGS. 1B & 1C, the mask layers are removed, leaving a trench disposed in the silicon layer. Typically, thereafter, the trenches are filled with a dielectric material such as an oxide (e.g., TEOS) to complete the formation of the shallow trench isolation. In general, the depth of the etch is controlled as a function of the etchant chemistry, and the amount of time involved in applying the etchant chemistry.

Among many process applications for STI techniques, the formation of Dynamic random access memory (DRAM) is one common example. DRAM is a kind of random access memory (RAM) for personal computers and workstations. Memory is the network of electrically-charged points in which a computer stores quickly accessible data in the form of 0s and 1s. Random access means that the PC processor can access any part of the memory or data storage space directly rather than having to proceed sequentially from some starting place. DRAM is dynamic in that, unlike static RAM (SRAM), the device needs to have its storage cells refreshed or given a new electronic charge every few milliseconds.

In general, two types of structures are used in DRAM manufacturing: (1) stacked capacitors, and (2) deep-trench capacitors. In a deep-trench capacitor structure, a poly-silicon material is embedded within (or adjacent to) a single-crystal silicon material. A cylinder of oxide material is formed adjacent to the poly-silicon material to thereby form an outer periphery (or collar) that extends to a certain depth. Note that in a DRAM cell, the collar is used in the formation of a capacitor that stores a charge. This charge is the physical occurrence of the data being stored in memory. The collar is an integral part of creating this capacitor cell. The collar serves as an isolation structure that allows individual contact with the memory cells. The collar is formed after most of the cell has been manufactured, and is germane to manufacture of this type of deep trench memory cell.

The etching process is thereby complicated by the need to etch both a single-crystal silicon substance and a poly-silicon substance within the same wafer. Moreover, as the etch proceeds downward, the oxide collar is encountered and must similarly be etched. In the end, the trenches are etched to a certain target depth. However, a certain amount of the oxide collar should remain above the etched surface for operational and contact purposes. Hence, in order to etch such a device, the etching process must be able to simultaneously etch through two or more different substances, i.e. single crystalline silicon, poly-crystalline silicon, and/or silicon dioxide (i.e. "oxide").

In a majority of prior art applications, the etching process has attempted to etch down through the various layers with near even selectivity. In other words, the etching process uses a chemistry that etches away all encountered substances at a near equal rate. With the etch rates for the example materials (i.e. crystal silicon, poly silicon, and/or oxide) as close to 1-to-1 as possible, a trench can be etched down to a desired level in only one process step. This is advantageous in that a single process step is much simpler (i.e. less costly and time consuming) to implement and execute.

In using such one step approaches, however, prior art applications have trouble independently controlling or modulating the height of the collar (or other such device that might extend above the level of the etched plane). By etching all materials simultaneously, the entire plane of the etched surface will generally be at one depth, with no differentiation between the etched height of the different IC structure materials.

Still another prior art technique uses a hard mask over various surface areas in order to etch different parts of the surface down to different levels. While generally effective to isolate surface areas, this technique is relatively more expensive and difficult to implement. Extra process steps are involved in placing and using the mask over the surface, and such steps add extra expense and difficulty in implementation.

A further prior art technique that might relate to the solution proposed by the present invention involves the formation of deep trenches in IC materials. In order to form relatively deep trenches (i.e. 100 angstroms, for micromachining, and the like), the process switches back and forth between different chemistries in forming the trench. A first chemistry would be used for etching. A second passivating layer would be added to coat the side walls of the structure. Etching is again performed and vice versa until the proper trench depth is achieved. The general purpose of this technique is to preserve the sidewall structures of the device. While the technique switches back and forth between different chemistries, it does not perform etching with each step, and with each different chemistry. As a result, this technique does not address etching different materials that might be formed adjacent, or embedded within one another, as per the inventive technique below.

In view of the foregoing, there are desired improved techniques for etching an IC structure that has two or more (adjacent or embedded) materials to be etched down to a target level. In particular, a technique is desired that will allow modulation or control over the height of an embedded material such as an oxide collar. The process should allow use of either a resist mask, or a hard mask, while maintaining certain profile requirements. Also desired are etch techniques that may be implemented "in situ" (all processing performed in one plasma processing chamber), or "ex situ" (certain isolated processing steps performed in different plasma processing chambers).

SUMMARY OF THE INVENTION

The invention relates, in one embodiment, to a process or method for etching a trench in an IC layer that might be comprised of several different types of materials. Certain IC structures, for instance DRAM devices and the like, include certain types of materials that might be embedded within, or arranged next to, a different type of structural material. In order to form functional devices from these IC structures, a trench, or series of trenches need to be formed within the materials. Techniques for trench formation and/or device isolation include STI and the like.

To etch down through a variety of materials, prior techniques have employed etchant chemistries that are capable of etching through all of the materials at a relatively equal rate. This leads to problems, however, in maintaining relative etch rates through the different materials, and maintaining the profile of the structural materials being etched.

The present invention instead uses a technique wherein the etchant chemistries are toggled, or alternated (among two or more chemistries), in order to etch a trench down into a multi-substance structure. While generally applicable to the formation of any sized trench, the present application is particularly useful for the formation of shallow trenches, i.e. less than 2 microns, and usually within the range of 0.3–1.0 microns or less.

A device might first be cleaned (or prepared), using a variety of techniques. Such steps might include an ARC open and/or breakthrough step. Thereafter, a first etching chemistry is applied to the IC structure, wherein the chemistry preferentially etches one type of structural material. A second step is applied which toggles back to a different type etching chemistry that preferentially etches yet a different kind of structural material. The process is repeated thereafter until a target depth for the trench is achieved within the structural material. By toggling back and forth, a more efficient etch can be achieved through the two (or more) different types of structural materials. This technique can also help to preserve a layer of photoresist over the entire IC structure, which might be etched away using one-step etching techniques.

Additionally, the use of different etchant chemistries allows a certain type of structural material to be modulated (or preserved) above the level of other materials, without the use of a hard mask. For instance, deep-trench DRAM devices use an oxide collar (functioning as a capacitor) which is embedded within surrounding poly-silicon and/or crystal-silicon materials. For access and testing purposes, it is desired to have a portion of this collar extend above the target level of the trench. It is also desired to preserve a certain shape (rounded or otherwise) of the exposed collar. The toggling method allows the trench to be etched down to a target level, while leaving a desired portion of the embedded material (collar or otherwise) exposed above the level of the etched surrounding material.

Hence, one advantage of the present invention over the prior art is the use of an etching technique that switches back and forth between different etchant chemistries in order to achieve a target depth and maintain certain structural profiles of different types of etched materials comprising the etched structure.

Still another advantage of the present invention is the ability to use either a hard mask, or a resist mask, while being able to maintain the profile requirements of the component structural materials. One type of material can also be modulated in height relative to the other materials.

According to one aspect of the present invention, a method is provided for etching a portion of an integrated circuit (IC) structure down to a certain target depth, the structure having a first component material area, and at least a second component material area arranged proximate to the first component material area, the method comprising: (i) applying a first type of etching chemistry which preferentially etches the first component material area; (ii) applying a second type of etching chemistry which preferentially etches the second component material area; and repeating steps (i) and (ii) until the certain target depth is achieved, wherein certain profiles of the IC structure and its component material areas are maintained by toggling back and forth between the etching chemistries.

According to another aspect of the present invention, a process is provided for etching to a target level a portion of an integrated circuit (IC) structure comprised of a plurality of different types of component materials, the process comprising: (i) applying an etching chemistry to preferentially etch certain types of the plurality of component materials;

(ii) applying an etching chemistry to preferentially etch certain remaining other types of the plurality of component materials; repeating steps (i) and (ii) until the target level is achieved, wherein certain profiles of the IC structure and its component material areas are maintained by toggling back and forth between the etching chemistries.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail so that the present invention is not unnecessarily obscured.

The present invention provides an etching process that toggles back and forth between different etching chemistries in order to reach a target depth through two or more different kinds of etchant materials. Various IC structures might arrange different substrate materials adjacent to each other, or embedded within each other, according to the needs in forming that functional device. As a result, the etching process will have to etch through two or more different substances in order to form a trench down through such adjacent/embedded materials. In particular, DRAM structures—using deep-trench capacitors or the like—present a structure that includes potentially three different materials to be etched through (i.e. single crystalline silicon, poly crystalline silicon, and/or an oxide collar).

Wherein a single type of etching chemistry can be used to etch through all substances simultaneously, this technique provides no control over etching one substance differently from another. Instead, the present invention provides for specific chemistries that are used to preferentially etch different materials. These chemistries are used in an alternating fashion as many times as necessary in order to achieve a target depth through the plurality of materials. By switching back and forth between the chemistries, the vertical profile of the IC structure is sufficiently maintained. Moreover, the aforementioned oxide collar can be controllably etched in such a manner as to leave a desired (accessible) amount of the oxide above the surface of the surrounding materials.

The present invention also allows for having a photoresist mask placed over the various layers of the IC structure. The etching technique will preserve enough of the photoresist mask, while still etching it, to provide a successful result. Prior techniques have used a hard mask (i.e. a different oxide mask) instead of the using the photoresist in order to modulate the depth and/or height of the collar. Hard masks, however, add considerable cost and complexity to the etching process. Also, the simpler technique of using a photoresist cannot generally be used when hard masks are employed.

Hence, two primary advantages of the present invention over the prior art include: (1) The ability to use different etching chemistries, and switching back and forth between them, to achieve a target depth through multiple materials while preserving certain vertical profiles of the IC structure. (2) The ability to use either a hard mask or a photoresist mask for the application, and modulating the final height of the collar (or similar structure) above the target depth of the etched trench.

Figure 2:
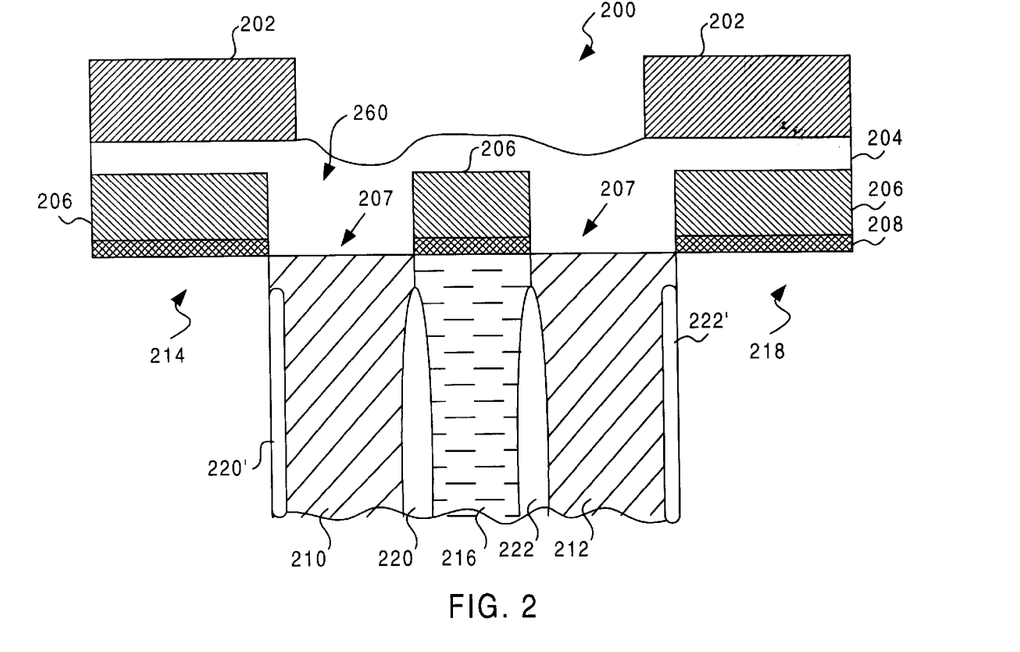
FIG. 2 is an embodiment of an example IC structure used in forming a DRAM device, before etching.

Referring now to FIG. 2, a cross-sectional diagram 200 is shown of an IC structure prior to etching. This structure includes materials arranged to form a deep-trench capacitor DRAM. In particular, this view shows an example of a perpendicular wordline (i.e. gate control, or GC line) between deep trenches. While this IC structure is used for example purposes to demonstrate and explain the present invention, other IC structures would also benefit from the described technique.

The structure is covered by a layer of photoresist, or a photoresist mask 202. The next layer 204 includes an organic BARC (bottom anti-reflective coating), which is a polymer that is used for patterning of the photoresist over nitride. A nitride layer 206 is shown with gaps 207 to be used in forming the trenches. Next, a thin layer of thermal oxide 208 is formed. A first and second area 210, 212 of poly-silicon material are shown formed between areas 214, 216, and 218 of single crystalline silicon material. Also formed within the structure is a collar of oxide material (i.e. TEOS oxide), shown as vertically extending deposits 220, 220' and 222, 222', which surround each of the poly-silicon areas. This particular cross sectional view results in the two columns of oxide material that form the cylinder, or collar (see FIGS. 13(a)–13(h) for perspective views of resulting collar).

Figure 3:
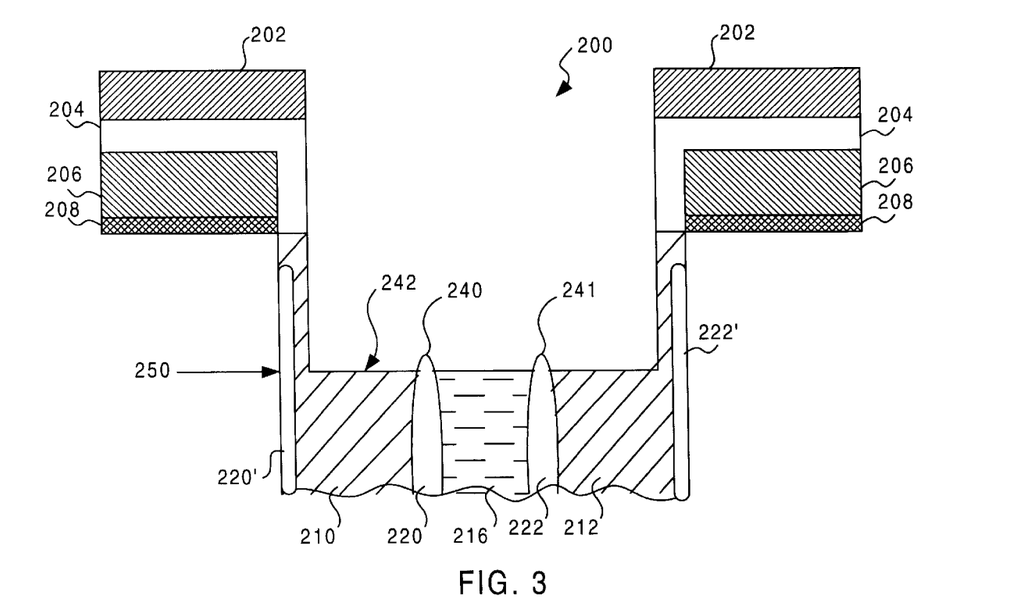
FIG. 3 is the IC structure used in forming a DRAM device of FIG. 3, after etching.

FIG. 3 shows the structure 200 of FIG. 2, with similar numbering of the elements, but after etching has been completed according to the present invention. In this figure, the single crystalline silicon area 216, and the poly-silicon areas 210 and 212 are etched down to a target depth, as shown by arrow 250. The columns of the oxide collar 220 and 222 are also etched downward. The end result provides for a desired amount of the collar material 240 and 241 extending above the surface 242. The process also provides for the collar material and vertical surfaces having the proper profile to render the device functional (and the collar accessible). The photoresist mask 202 has also been etched somewhat by the process, but remains intact, and therefore provides a successful etch.

An IC structure will often come from a production process (i.e. a customer desiring further etching of the device) in a state similar to that shown in FIG. 2. As such, the uppermost BARC layer 260 and center nitride layer 206 (i.e. collectively comprising a form of mask) should be etched downward, and the resulting surfaces should be cleaned, in order to apply the toggling chemistry technique of the present invention. As a first part of the cleaning (or preparation) step, an etching chemistry that includes Cl2 and O2 will be used to etch away or open most of the upper BARC layer 260. This particular chemistry etches nitride relatively slowly. While any ratio ranging from approximately 1-to-1 to 5-to-5 (i.e. parts Cl2-to-O2) can be used, a preferred ratio includes 3-to-1. A second cleaning (or preparation) step will thereafter be applied with etching chemistry that includes CF4 and CHF3. This chemistry serves to remove the rest of the nitride that is left behind from the previous step. A ratio ranging from approximately 1-to-1 to 8-to-1 (i.e. parts CF4-to-CHF3) can be used, with a preferred ratio including 3-to-1.

It should be noted that this initial cleaning (or preparation) step might be performed in situ with the toggling technique of the present invention. Alternatively, the initial step might be performed ex situ, wherein the resulting product will resemble FIG. 4, and the toggling technique of the present invention can thereafter be applied.

Figure 4:
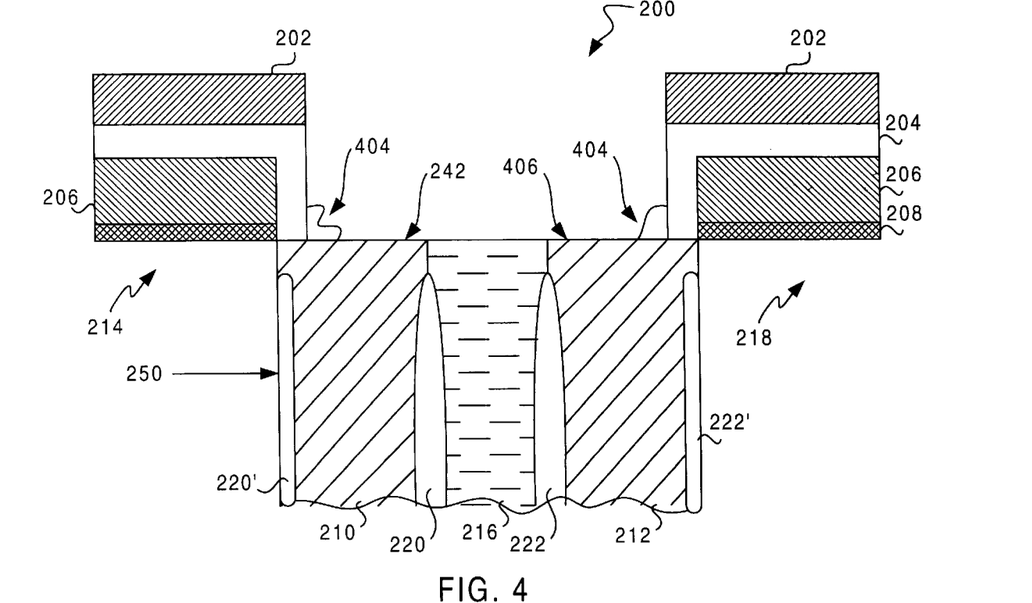
FIG. 4 is the IC structure used in forming a DRAM device of FIG. 2, after initial cleaning and etching steps have been applied.

Referring now to FIG. 4, the resulting IC structure 200 is shown with the elements numbered similar to those in the Figures above. The BARC layer 260, the center nitride portion 206, and the thermal oxide layer 208 have been removed. The surface 242 might further contain residuals from the resist, so a subsequent short cleanup step might thereafter be applied to clean surface. Such residuals might include organic residuals 404, or native oxide residuals 406. A short breakthrough step is used to clear any oxides off of the surface 402. The organic residuals are cleaned with a chemistry including Cl2 and O2 (as per the ratios above). Native oxide residuals are removed using a CF4 and CHF3 type chemistry (as per the ratios above).

Figure 5:
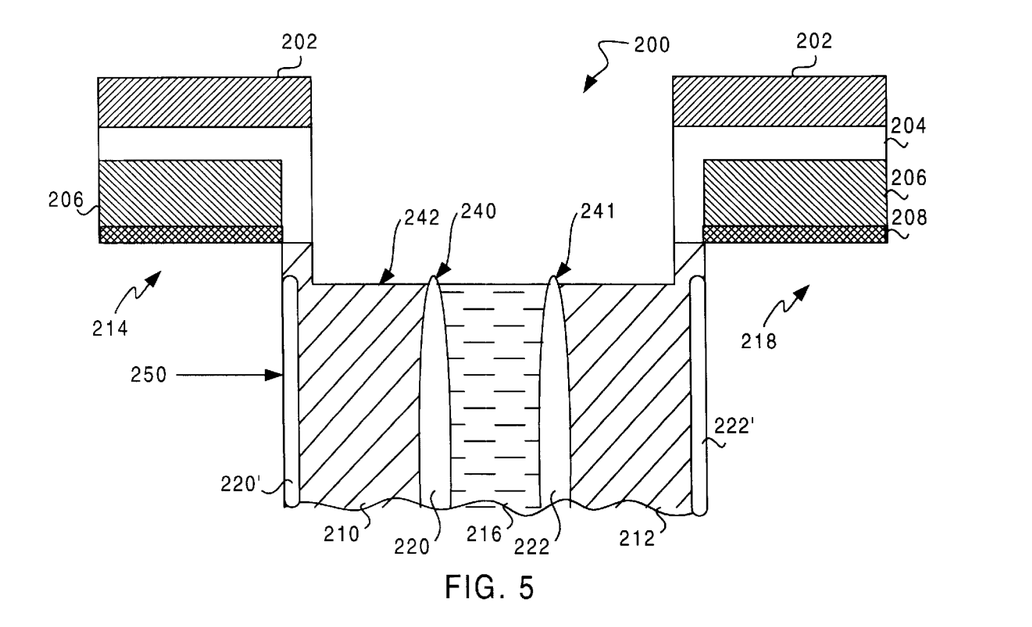
FIG. 5 is the IC structure used in FIG. 4, after etching has been performed to first expose the oxide collar materials.

Apart from the cleaning steps, which might toggle back and forth between different etching chemistries, the first step of the present invention is applied to the cleaned surface 242 from FIG. 4. In this step, a chemistry of Cl2 and HBr (Hydrogen Bromide) is applied which preferentially etches down through the poly-silicon 210, 212 and crystal silicon 216 materials. While any ratio might be used that effectively etches the materials, a preferred ratio of Cl2-to-HBr includes 1-to-3. Referring now to FIG. 5, the structure 200 is again shown with the elements similarly numbered. The surface 242 is shown etched downward, closer to the target level 250. This chemistry does not preferentially etch the oxide material 220 and 222, and hence the collars 240 and 241 begin to show above the level of surface 242.

Figure 6:
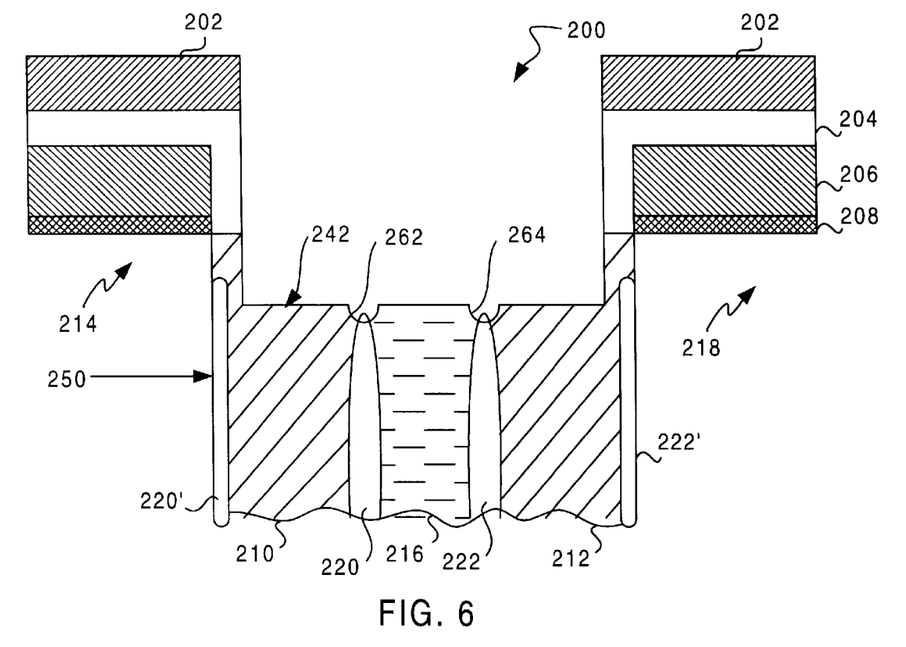
FIG. 6 is the embodiment of FIG. 5 after a first etching step has been applied which is preferential to etching only the oxide collar.

Referring now to FIG. 6, the IC structure 200 is shown with the elements numbered similarly to the prior figures. In this next step, the etching chemistry is switched to a mixture of CF4 and CHF3, which preferentially etches the oxide material 220 and 222. As such, the surface 242 is shown with indentations 262 and 264 etched (generally) down into the oxide columns.

Figure 7:
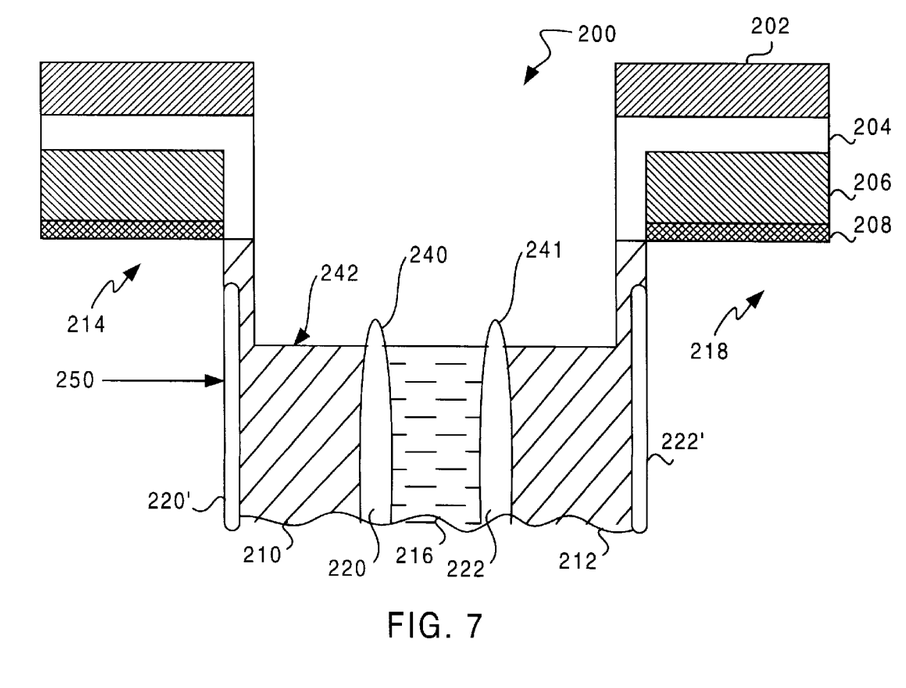
FIG. 7 is the embodiment of FIG. 6 after a second etching step has been applied which is preferential to etching only materials surrounding the oxide collar material.

The next step switches back to a mixture of Cl2 and HBr in order to preferentially etch the silicon materials surrounding the oxide columns. FIG. 7 again shows the IC structure 200 with elements numbered similarly to prior figures. This chemistry etches the trench surface 242 down further towards the target level 250, which exposes more of the collar oxide material 240 and 241, while maintaining its general profile.

Figure 8:
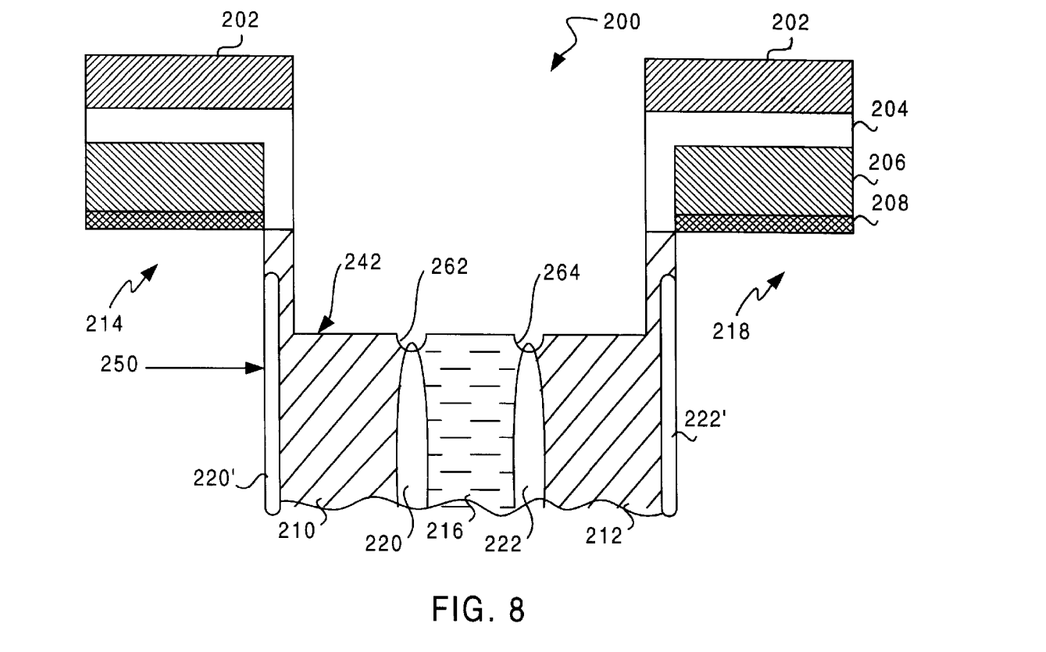
FIG. 8 is the embodiment of FIG. 7 after a third etching step has been applied which toggles back and is preferential to etching only the oxide collar.

The next step again toggles, or switches back to a mixture of CF4 and CHF3 to preferentially etch the oxide column material 220 and 222. FIG. 8 again shows the IC structure 200 with the elements similarly numbered from the prior figures. Again, the areas 262 and 264 have been etched in the regions of the oxide columns, below the level of the surface 242.

Figure 9:
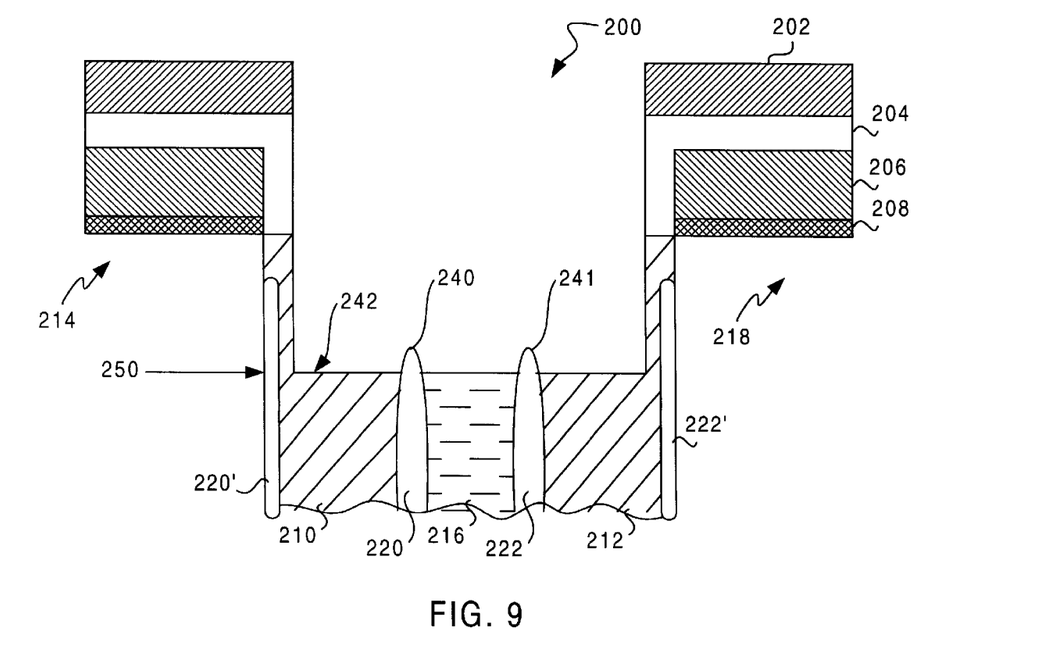
FIG. 9 is the embodiment of FIG. 8 after a fourth etching step has been applied which toggles back and is preferential to etching only materials surrounding the oxide collar material.

Still another step toggles back again to a mixture of Cl2 and HBr in order to further etch the silicon surface down towards the target level 250. FIG. 9 again shows the IC structure 200 with the elements similarly numbered from the prior figures. The surface 242 has been etched downward to further expose parts of the collars 240 and 241, which have retained a desirable profile.

Figure 10:
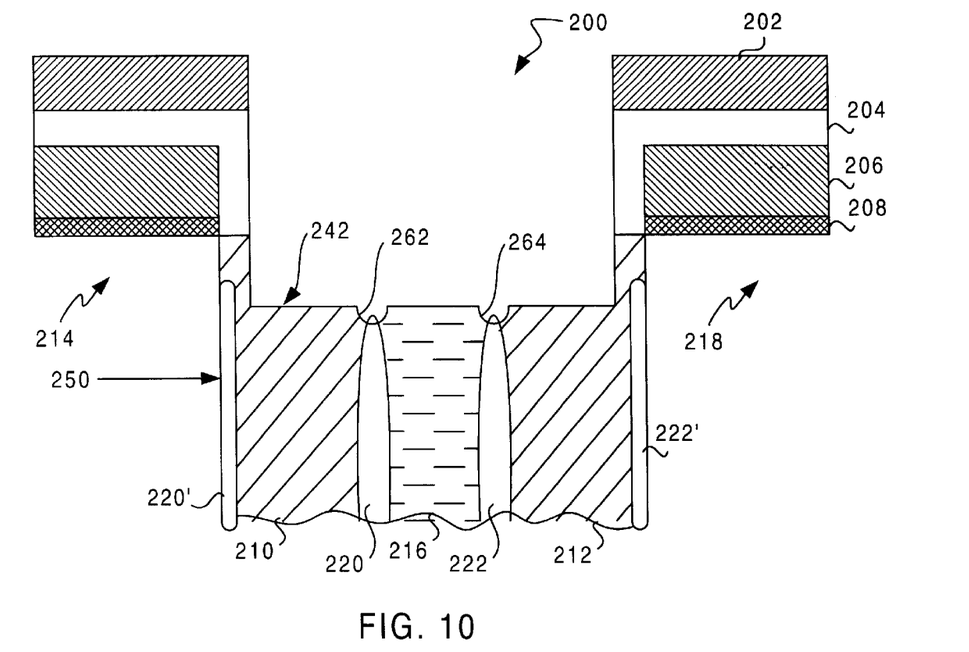
FIG. 10 is the embodiment of FIG. 9 after a fifth etching step has been applied which toggles back and is preferential to etching only the oxide collar.

Referring now to FIG. 10, the IC structure 200 is shown with the elements similarly numbered. The process toggles back again to a mixture of CF4 and CHF3 to preferentially etch the oxide column material 220 and 222. Indentations 262 and 264 are again shown to indicate the preferential etching of the oxide column material below the level of surface 242.

Figure 11:
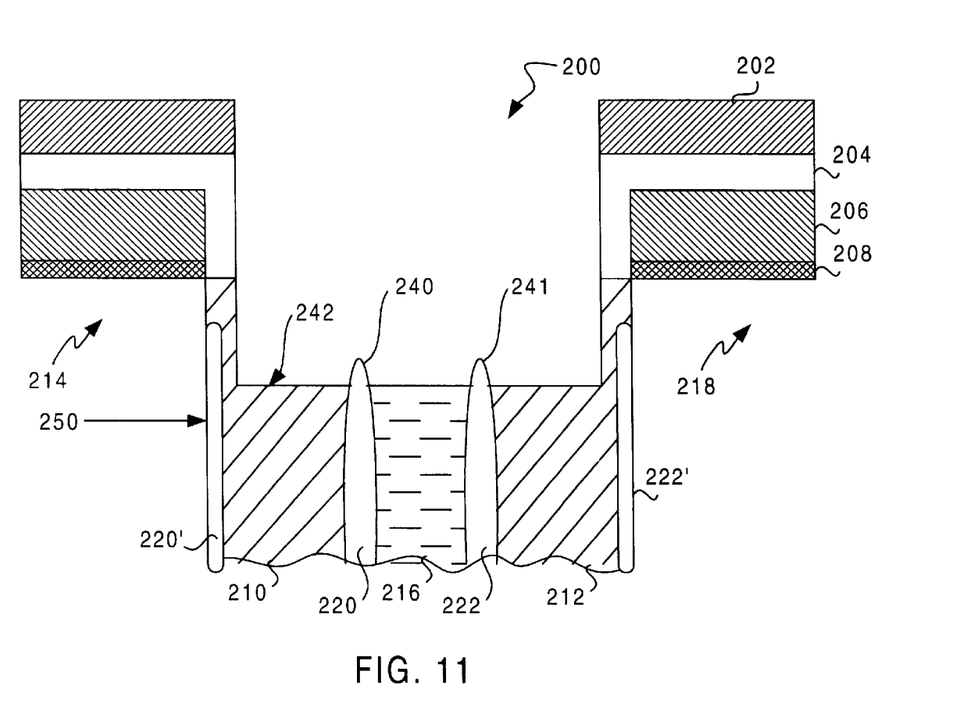
FIG. 11 is the embodiment of FIG. 10 after a sixth etching step has been applied which toggles back and is preferential to etching only materials surrounding the oxide collar material, and etches down to a target depth.

FIG. 11, as similarly numbered above, shows the result of toggling back again to the chemistry including Cl2 and HBr in order etch surface 242 down to the target level 250. This further exposes oxide portions of columns 220 and 222 that comprise the exposed collars 240 and 241.

Figure 12:
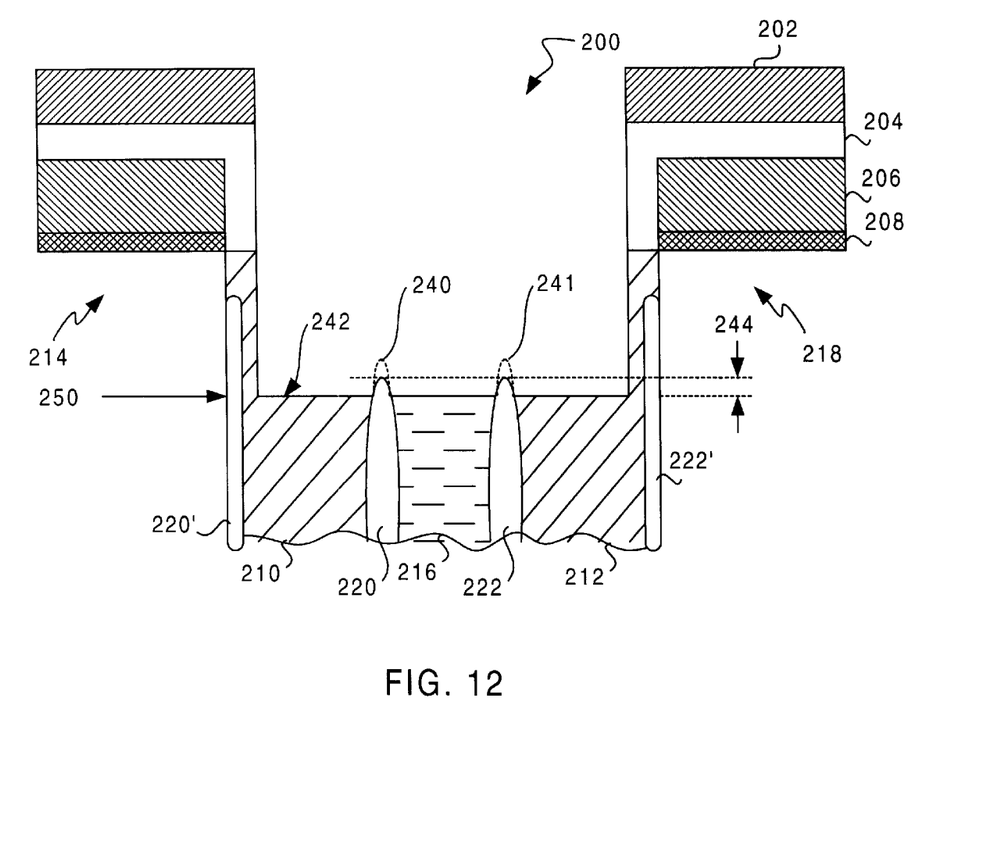
FIG. 12 is the embodiment of FIG. 11 after a seventh etching step has been applied which toggles back and is preferential to etching only the oxide collar, and serves to finally etch and shape the collar down to a desired height.

Finally, a last step can be employed which further etches, or shapes, the exposed oxide collar material. FIG. 12 shows the IC structure 200 with the elements similarly numbered as before. The chemistry is finally toggled back to etch the collars 240 and 241 down to a controllable height 244 above the surface 242. As shown, only a portion of collars 240 and 241 are removed (see dotted line) so that collar height 244 might remain at a usable level, for instance 100–200 angstroms.

Note that while a certain number of steps have been illustrated that toggle back and forth between two different chemistries, the process is not limited to using only two chemistries. The process might, for instance, employ any number of chemistries in sequence, and then toggle back to repeating that sequence in order to complete the etch. Also, the number of toggling steps might be more or less than the number illustrated above. Generally, the toggling should continue until the proper results are achieved.

FIGS. 13(a)–13(h) next show photographic views of the IC structures after etching has been performed, and after the photoresist and BARC layer have been removed. These Figures serve to better illustrate the results achieved by the present technique.

Figure 13:
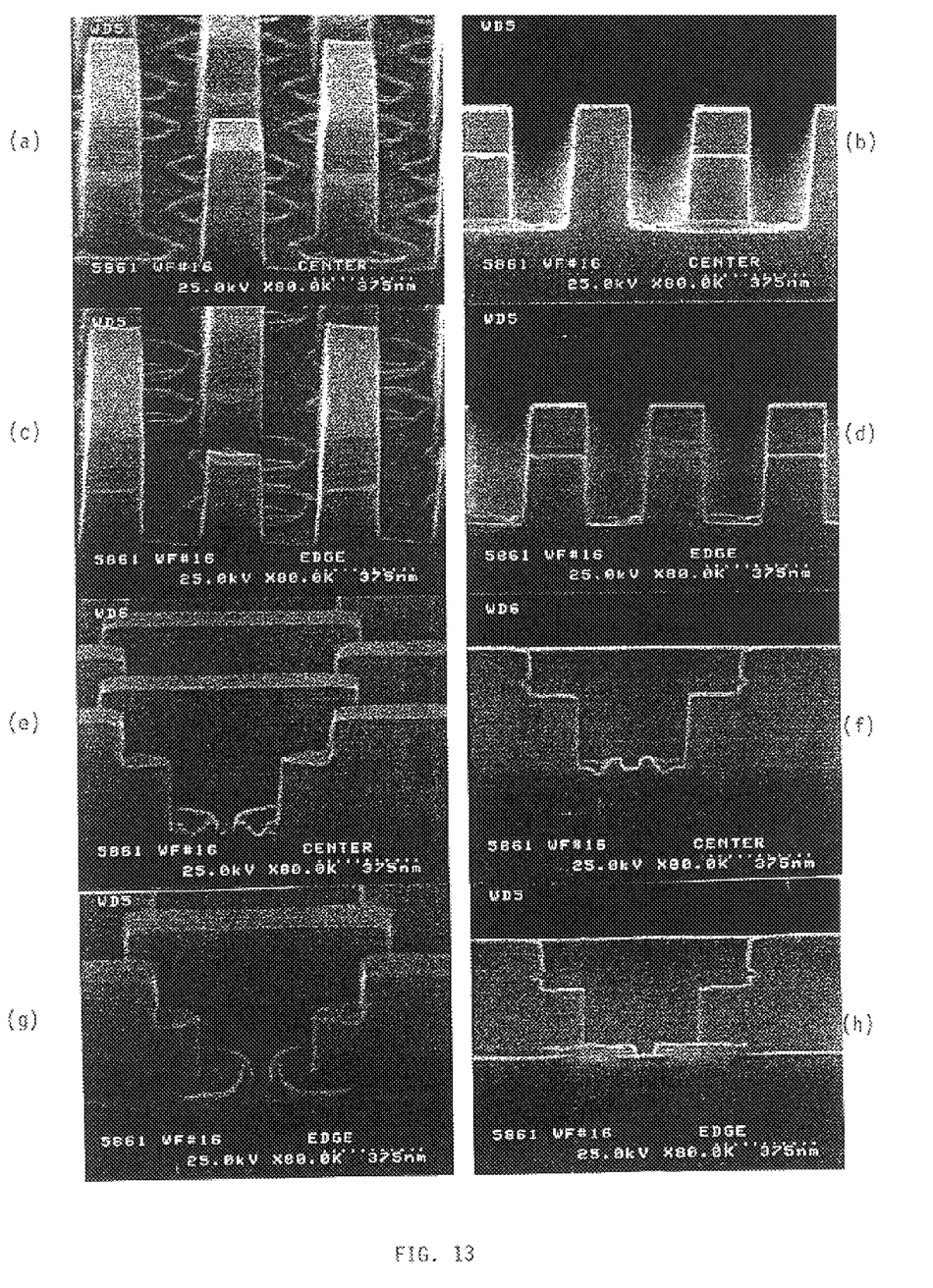
FIGS. 13(a)–13(h) show certain perspective and side-cut views of the IC structure as formed, with the collar accessibly extending above the target etch level of the surrounding structural materials.

FIG. 13(a) shows a top perspective center view of the IC structure from a first angle showing the silicon materials with the trenches etched there between, and the collar material extending above the etched surface.

FIG. 13(b) shows a side-cut view of the IC structure from FIG. 13(a).

FIG. 13(c) shows a perspective edge view of the IC structure, rotated 90 degrees from that shown in FIG. 13(a).

FIG. 13(d) shows a side-cut view of the IC structure from FIG. 13(b).

FIG. 13(e) shows a close-up of a top perspective center view of the resulting trench, which shows the first and second collar formation above the target level of the etched surface.

FIG. 13(f) shows a side-cut view of the IC structure from FIG. 13(e), as cut through the middle of the collar formations.

FIG. 13(g) shows an alternative close-up of a top perspective edge view of the resulting trench, which shows the whole first and second collar formations, each extending around the poly-silicon material.

FIG. 13(f) shows a side-cut view of the IC structure from FIG. 13(f).

The present invention is meant to extend beyond the present example of providing a collar in a deep-trench DRAM device. The toggling method of the present invention can be used to etch any of a variety of materials beyond those presented in the above examples. As a result, the invention is meant to include toggling between a variety of different chemistries (or mixtures) in order to properly etch the different structural materials. The present invention is meant to address the problems encountered with using one type of etching chemistry in order to achieve a target depth. It has been found that by using one etchant for an extended period of time, the etching process becomes less effective over time, and the profiles of the IC structure components might be adversely affected. The present method of toggling between different etchant chemistries serves to provide an effective etch down to a target depth. Additionally, certain embedded (or adjacent) structural materials (such as the example collar) can be modulated or controlled above the surface of the target depth.

Hence, while this invention has been described in terms of several preferred embodiments, there are alterations, permutations, and equivalents which fall within the scope of this invention. By way of example, although the etch steps are performed in situ in accordance to a preferred embodiment, they may be performed in different processing chambers if desired. An in situ process generally proves to be more efficient, as the etched structure does not need to be transferred from one etching machine to another. It should also be noted that there are many alternative ways of implementing the etching process described in the present invention (i.e. different methods and apparatus). It is therefore intended that the following appended claims be interpreted as including all such alterations, permutations, and equivalents as fall within the true spirit and scope of the present invention.

What is claimed is:

1. A method for etching a portion of an integrated circuit (IC) structure down to a certain target depth, the structure having a first component material area, and at least a second component material area arranged proximate to the first component material area, the method comprising:
   (i) applying a first type of etching chemistry which preferentially etches the first component material area;
   (ii) applying a second type of etching chemistry which preferentially etches the second component material area; and
   repeating steps (i) and (ii) until the certain target depth is achieved, wherein certain profiles of the IC structure and its component material areas are maintained by toggling back and forth between the etching chemistries.

2. The method of claim 1, wherein etching a portion of an IC structure includes the formation of shallow trench isolation (STI) features.

3. The method of claim 1, wherein the first type of etching chemistry and second type of etching chemistry are applied in situ.

4. The method of claim 1, wherein the second component material area is embedded within the first component material area.

5. The method of claim 4, wherein a portion of the second component material area is modulated in height relative to the first component material area via toggling back and forth between the etching chemistries.

6. The method of claim 5, wherein the IC structure is a memory device, with the first component material area including at least a poly-silicon portion of material and a crystalline silicon portion of material and the second component material area including at least silicon oxide material.

7. The method of claim 5, wherein the memory device is a DRAM having deep trench capacitors.

8. The method of claim 6, wherein the second component material area is in the shape of a collar surrounding the poly-silicon material portion of material, whereby the toggling back and forth between the etching chemistries maintains the profile of the collar.

9. The method of claim 1, wherein the first type of etching chemistry preferentially etches crystalline or amorphous silicon materials.

10. The method of claim 9, wherein the materials include poly and single crystalline silicon materials.

11. The method of claim 10, wherein the first type of etching chemistry includes a mixture of Cl2 and HBr.

12. The method of claim 11, wherein the preferred ratio of Cl2-to-HBr is approximately 1-to-3.

13. The method of claim 9, wherein the second type of etching chemistry preferentially etches oxide materials.

14. The method of claim 13, wherein the second type of chemistry includes a mixture of CF4 and CHF3.

15. The method of claim 14, wherein the preferred ratio of CF4-to-CHF3 is approximately 3-to-1.

16. The method of claim 1, wherein the etching steps are used in association with a photoresist mask over at least a portion of the IC structure.

17. The method of claim 1, wherein the etching steps are used in association with a hard mask over at least a portion of the IC structure.

18. A process for etching to a target level a portion of an integrated circuit (IC) structure comprised of a plurality of different types of component materials, the process comprising:
  (i) applying an etching chemistry to preferentially etch certain types of the plurality of component materials;
  (ii) applying an etching chemistry to preferentially etch certain remaining other types of the plurality of component materials;
  repeating steps (i) and (ii) until the target level is achieved, wherein certain profiles of the IC structure and its component material areas are maintained by toggling back and forth between the etching chemistries.

19. The process of claim 18, wherein the process of etching to a target level a portion of an IC structure includes the formation of shallow trench isolation (STI) features.

20. The process of claim 18, wherein different etching chemistries are applied in situ.

21. The process of claim 19, wherein one type of component material is embedded within another type of component material.

22. The process of claim 17, wherein one type of component material is modulated in height relative to another type of component material via toggling back and forth between the etching chemistries.

23. The process of claim 22, wherein the IC structure is a memory device with a first type of component material including at least a poly-silicon portion of material and a crystalline silicon portion of material and a second type of component material area including at least silicon oxide material.

24. The process of claim 23, wherein the memory device is a DRAM having deep trench capacitors.

25. The process of claim 23, wherein the second type of component material is in the shape of a collar surrounding the poly-silicon material portion of material, whereby the toggling back and forth between the etching chemistries maintains the profile of the collar.

26. The process of claim 18, wherein the etching chemistry in step (i) preferentially etches crystalline or amorphous silicon materials.

27. The process of claim 26, wherein the materials include poly and single crystalline silicon materials.

28. The process of claim 26, wherein the etching chemistry in step (i) includes a mixture of Cl2 and HBr.

29. The process of claim 28, wherein the preferred ratio of Cl2-to-HBr is approximately 1-to-3.

30. The process of claim 26, wherein the etching chemistry in step (ii) preferentially etches oxide materials.

31. The process of claim 30, wherein the etching chemistry in step (ii) includes a mixture of CF4 and CHF3.

32. The process of claim 31, wherein the preferred ratio of CF4-to-CHF3 is approximately 3-to-1.

33. The method of claim 18, wherein the etching steps are used in association with a photoresist mask over at least a portion of the IC structure.

34. The method of claim 18, wherein the etching steps are used in association with a hard mask over at least a portion of the IC structure.

* * * * *